United States Patent [19]

Cote et al.

[11] Patent Number: 5,187,121

[45] Date of Patent: Feb. 16, 1993

[54] PROCESS FOR FABRICATION OF A SEMICONDUCTOR STRUCTURE AND CONTACT STUD

[75] Inventors: Donna R. Cote, Poughquag; David Stanasolovich, Wappingers Falls, both of N.Y.; Ronald A. Warren, Essex Junction, Vt.

[73] Assignee: International Business Machines Corporation, Armonk, N.Y.

[21] Appl. No.: 810,004

[22] Filed: Dec. 18, 1991

[51] Int. Cl.$^5$ .............................. H01L 21/44
[52] U.S. Cl. ..................... 437/195; 437/228; 437/189; 437/190; 156/644
[58] Field of Search ............... 437/190, 195, 228, 189; 156/644

[56] References Cited

U.S. PATENT DOCUMENTS

| | | | |
|---|---|---|---|
| 4,410,622 | 10/1983 | Dalal et al. | 430/312 |
| 4,543,707 | 10/1985 | Ito et al. | 29/578 |
| 4,702,792 | 10/1987 | Chow et al. | 156/628 |
| 4,743,568 | 5/1988 | Wood | 437/189 |
| 4,883,767 | 11/1989 | Gray et al. | 437/228 |
| 4,933,303 | 6/1990 | Mo | 437/190 |
| 4,956,313 | 9/1990 | Cote et al. | 437/203 |
| 4,997,790 | 3/1991 | Woo et al. | 437/195 |
| 5,008,216 | 4/1991 | Huang et al. | 437/192 |
| 5,008,730 | 4/1991 | Huang et al. | 357/68 |
| 5,039,620 | 8/1991 | Yamazaki et al. | 437/228 |
| 5,055,423 | 10/1991 | Smith et al. | 437/187 |
| 5,068,207 | 11/1991 | Manocha et al. | 437/231 |

Primary Examiner—Brian E. Hearn
Assistant Examiner—Laura M. Holtzman
Attorney, Agent, or Firm—Richard Lau

[57] ABSTRACT

Self-aligning process for fabricating a semiconductor structure and stud therefor on a semiconductor substrate comprises depositing a first material onto the substrate, depositing a second material onto the first material, removing excess portions of second material so as to form openings through the second material exposing excess portions of first material, whereby a selected portion of second material is retained and forms a sacrificial element, removing the excess portions of first material selectively to the substrate so as to extend the openings through the first material to the substrate, whereby a selected portion of first material is retained and forms the semiconductor structure, filling the openings with an insulating material, removing the sacrificial element selectively to the insulating material and the semiconductor structure for forming a contact window opening for allowing access to the semiconductor structure, and filling the contact window opening with stud material so as to contact the semiconductor structure for forming the stud.

31 Claims, 2 Drawing Sheets

PROCESS FOR FABRICATION OF A SEMICONDUCTOR STRUCTURE AND CONTACT STUD

TECHNICAL FIELD

The present invention relates generally to semiconductor devices and, more particularly, to the fabrication of a semiconductor structure and stud therefor.

BACKGROUND OF THE INVENTION

The trend in semiconductor fabrication technology continues towards increasing circuit density, and thus further microminiaturization of semiconductor structures is highly desirable. A semiconductor structure in this context is defined as any region, device, component, or element thereof that can be grown, formed, diffused, implanted, deposited, etc. into or onto a semiconductor substrate. For example, the gate conductor in today's high speed semiconductor transistor devices has diminished to a horizontal width of $0.4 \times 10^{-6}$ meters, and it is foreseen that the horizontal width will further decrease to $0.1 \times 10^{-6}$ meters.

A stud is an electrically conductive element which contacts a semiconductor structure and allows for electrical connection with another semiconductor structure. Typically, a stud is fabricated so as to contact the top of the structure. Accordingly, as the horizontal width of a semiconductor structure decreases, the available area for forming a stud to contact the top of the structure also decreases. Thus, a high degree of accuracy is required to properly form and align a stud so as to contact a microminiaturized semiconductor structure. In other words, increased microminiaturization of semiconductor structures leads to the problem of decreased alignment error tolerance when fabricating a contact stud for contacting the top of such a structure.

Traditionally, in order to form a contact window for fabricating a stud for a semiconductor structure, a border is included around the edges of the contact window. Such a border generally has dimensions which are greater than the dimensions of the required contact window, and is used to insure that, even under worst case conditions, the contact window and stud will fall on top of the semiconductor structure. Further, the borders guard against the contact window and stud falling partially on the semiconductor structure and partially on an undesired region, such as the field oxide. In such a situation, the field oxide may be consumed by an overetch and a leakage path may be formed from the semiconductor structure to the substrate. However, an undesirable effect associated with using a border around a contact window is that the area required for forming a contact window and stud is significantly increased. Consequently, the maximum number of integrated circuits that can be packed into a given area on a chip becomes limited.

One attempt to form a contact window and stud for contacting the top of a semiconductor structure while maintaining circuit density makes use of a borderless fabrication method. In contrast to a bordered method, the borderless method does not require borders around the edges of the contact window. Accordingly, the amount of space required to form the contact window and stud is minimized so that, in comparison to the bordered method, a greater number of circuits can be packed into a given area on a chip. However, decreased alignment error tolerance associated with current day microminiaturization of semiconductor structures has made it exceedingly difficult to use a borderless method to form a contact window which falls directly on top of a structure without effectuating an undesired overetch, and resulting in a leakage path.

Moreover, borderless methods of fabricating studs generally result in only partially contacting the top of the semiconductor structure. Since the horizontal width of semiconductor structures has diminished to such a great extent, partial contact with such a structure frequently leads to problems of reliability. In other words, since the stud contacts only a portion of the top of the semiconductor structure, such contact may not provide adequate electrical connection to the structure for proper operation.

SUMMARY OF THE INVENTION

It is therefore an object of the present invention to further increase circuit density and allow for further microminiaturization of semiconductor structures and devices.

It is another object of the present invention to provide a fabrication process which can accurately and properly form a contact window and stud on top of a semiconductor structure.

It is yet a further object of the invention to form a contact window on top of a semiconductor structure without undesired overetch associated with other methods of fabrication.

It is still another object of the invention to provide a process for fabricating a stud which will substantially contact the entire top portion of a semiconductor structure.

In order to accomplish the above and other objects of the invention, a process for fabricating a semiconductor structure and stud therefor on a semiconductor substrate comprises depositinq a first material onto the substrate; depositing a second material onto the first material; removing excess portions of the second material so as to form openings through the second material exposing the first material, whereby selected portions of the second material are retained for forming a sacrificial element; removing excess portions of the first material so as to extend the openings through the first material, whereby a selected portion of the first material is retained for forming the semiconductor structure, the semiconductor structure having the sacrificial element situated thereon; filling the openings with a first insulating material for insulating the semiconductor structure; removing the sacrificial element selectively to the insulating material and the semiconductor structure for forming a contact window opening for allowing access to the semiconductor structure; and filling the contact window opening with stud material so as to contact the semiconductor structure for forming the stud.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENTS

Figure 1A:
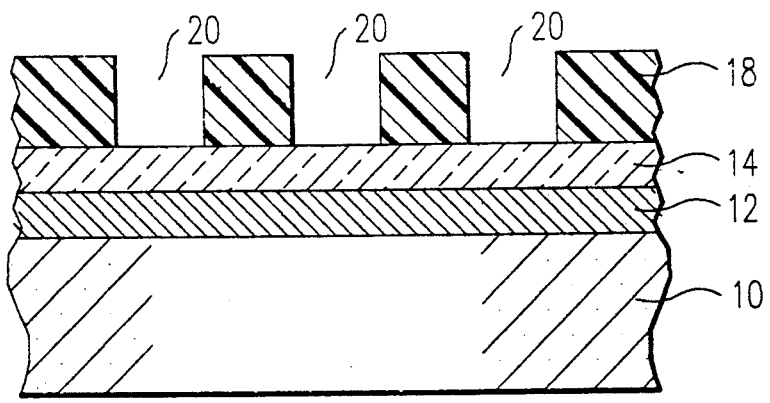
FIGS. 1A-1I are diagrammatic cross-sectional views showing a portion of a substrate during various stages of processing in accordance with the present invention.

Referring initially to FIG. 1A, there is shown a substrate 10, which is typically monocrystalline silicon or other semiconductor material. A layer of structure material 12 is deposited on the substrate 10, and comprises material appropriate for forming semiconductor structures on the substrate 10 as may be required for fabrication of a semiconductor device. For example, if a gate electrode is to be fabricated for an FET device, then the material utilized to form the layer of structure material 12 will be comprised of an appropriate metal for forming such a gate electrode, for instance, polysilicon, titanium silicide, or the like. Further, a layer of sacrificial-/etch selective material 14 is deposited on the layer of structure material 12, and may be comprised of an insulating material, preferably having certain etch selective properties which will be discussed in greater detail hereinafter.

As shown, a first layer of photoresist material is applied over the layer of sacrificial/etch selective material 14, and patterned using standard photolithographic techniques of exposure and development so as to form a first photoresist mask 18. The pattern of the first photoresist mask 18 is appropriate for forming sacrificial elements and etch selective elements. Specifically, the first photoresist mask 18 is patterned so as to cover portions of the sacrificial/etch selective material 14 at suitable locations, relative to the substrate 10, for forming the sacrificial elements and etch selective elements. As will be described hereinafter, the sacrificial elements and etch selective elements are used in forming the semiconductor structures and corresponding studs therefor.

The pattern of the first photoresist mask 18 further includes openings 20 which expose excess portions of sacrificial/etch selective material 14. In other words, the excess portions of the sacrificial/etch selective material 14 are those portions which are not required to form the sacrificial elements and etch selective elements, and these excess portions are exposed by the openings 20 of the first photoresist mask 18.

Figure 1B:
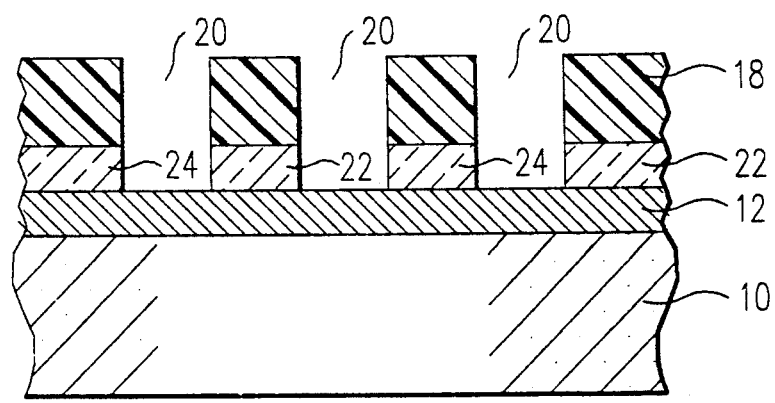

As shown in FIG. 1B, the pattern of the first photoresist mask 18 is transferred to the sacrificial/etch selective material 14 by removing the excess portions of sacrificial/etch selective material 14 as exposed by the openings 20. As such, excess portions of the structure material 12 are exposed by the openings 20, and sacrificial elements 22 and etch selective elements 24 are formed. Note that designation of the elements herein as being sacrificial elements or etch selective elements is arbitrary. In this regard, it is important to understand that the sacrificial elements will be removed and replaced by studs, and the etch selective elements will not be removed and replaced by studs. Thus, in practice, any combination of elements can be selected as sacrificial elements or etch selective elements, and this selection is dictated by the requirements of the particular device(s) being fabricated.

Since the excess portions of structure material 12 will also eventually be removed, it is not necessary that the excess portions of sacrificial/etch selective material 14 be removed with a high degree of selectivity to the excess portions of structure material 12. Illustratively, if boron nitride is utilized as the layer of sacrificial/etch selective material 14, then a reactive plasma or reactive ion etching (RIE) technique provides adequate anisotropy for effectively removing the excess portions of sacrificial/etch selective material 14, using approximately the following parameters:

10% $CF_4$ in $O_2$ or 12% $CHF_3$ in $O_2$
80 mTORR of pressure
400 watts of power
20 Gauss of magnetic field See, generally, copending U.S. application, Ser. No. 784,193, assigned to the assignee of the present invention.

Figure 1C:
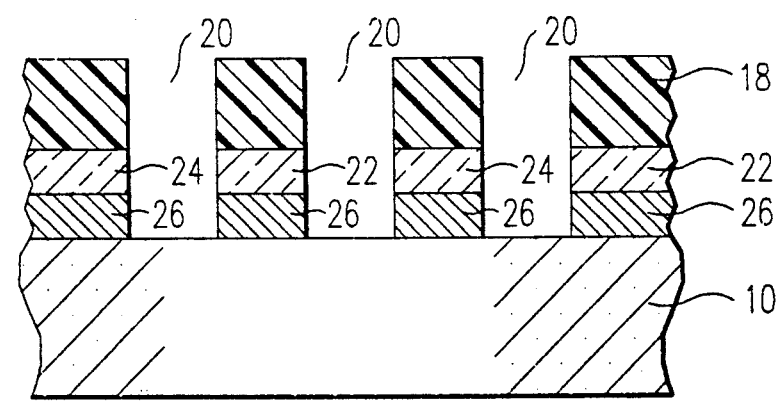
Figure 1D:
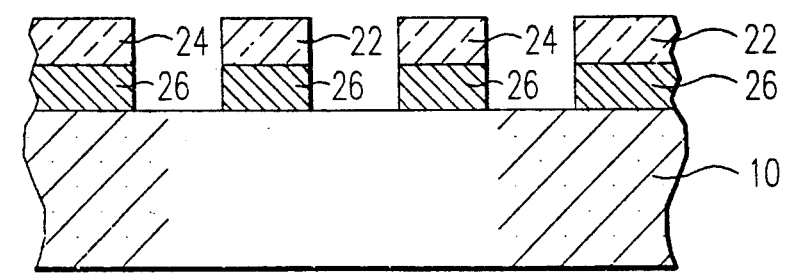

The excess portions of structure material 12 now exposed by the openings 20 can then be removed by a conventional etching technique suitable for providing adequate etch selectivity to the underlying substrate 10. As shown in FIG. 1C, removal of the excess portions of structure material 12 results in extending the openings 20 to the substrate 10, and in the formation of semiconductor structures 26, each having a sacrificial element 22 or an etch selective element 24 situated thereon. The photoresist mask 18 situated on the elements 22,24 is then stripped, as shown in FIG. 1D.

It should be understood that the excess portions of sacrificial/etch selective material 14 and excess portions of structure material 12 are described and depicted herein as being removed in two separate steps for illustrative purposes only. In this regard, such removal can also be effectuated in a single step.

Figure 1E:
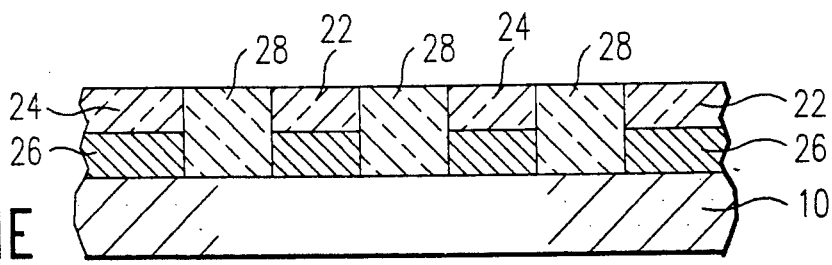

Next, the openings 20 are filled with an insulating material 28, such as oxide, which insulates the semiconductor structures 26. Such filling can be accomplished by an appropriate conventional deposition method, such as chemical vapor deposition. As shown in FIG. 1E, the insulating material 28 is planarized so that the top of the insulating material 28 is substantially coplanar with the top of the etch selective elements 22,24. In one embodiment, such planarization is accomplished by polishing. For polishing, it is preferable that the insulating material 28 have polish selectivity to the elements 22,24. More specifically, it is preferable for the elements 22,24 to polish at a slower rate than the insulating material 28, so that the elements 22,24 can function as a "stop" during polishing of the insulating material 28.

Figure 1F:
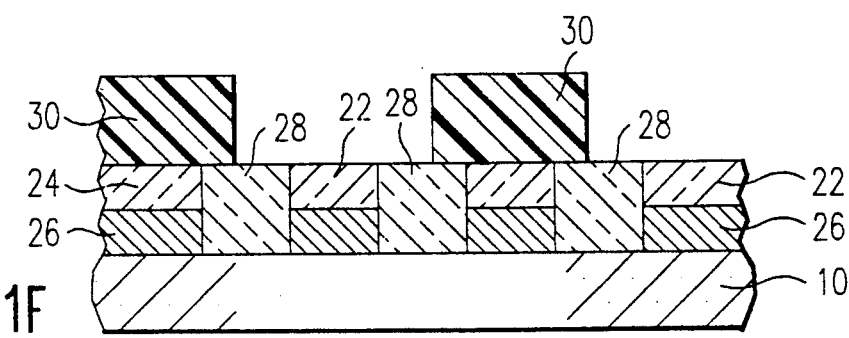
Figure 1G:
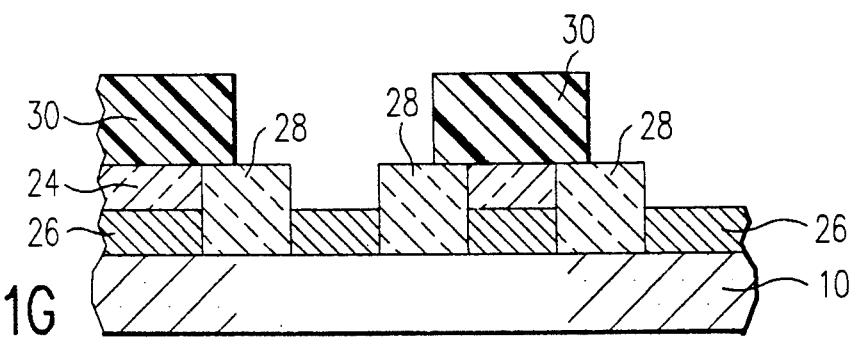
Figure 1H:
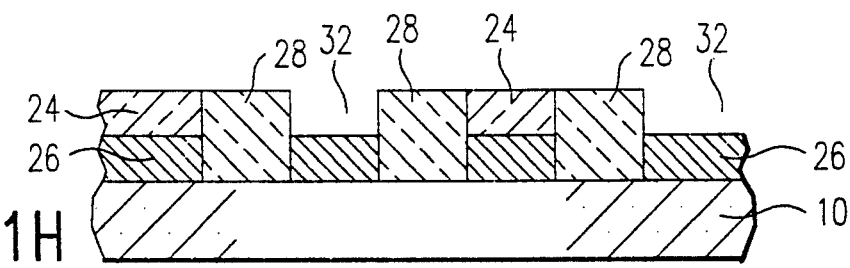
Figure 1I:
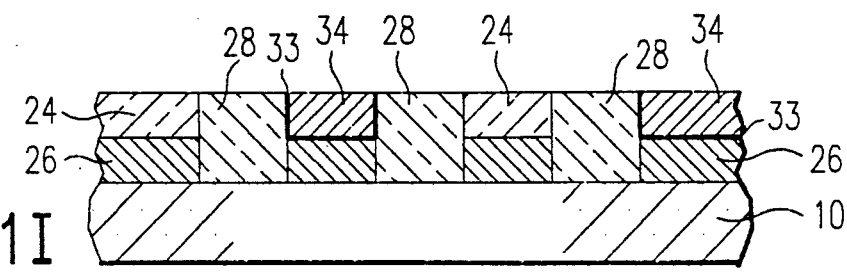

Moreover, it should be understood that polishing is one method of planarizing material during fabrication of semiconductor devices and structures, and other methods of planarization known in the Reference is now made to FIG. 1I. If required, before backfilling the contact windows 32 with stud material, liners 33 can be deposited so as to line the contact windows 32. The liners 33 reduce contact resistance between the semiconductor structures 26 and corresponding contact studs 34, and improves adhesion of the contact studs 34 to the semiconductor structures 26 and insulating material 28, thus alleviating problems of delamination. By way of example, the liners 33 can comprise titanium, titanium nitride, or other similar conductive material.

The contact windows 32 are backfilled with appropriate electrically conductive stud material, such as tungsten, titanium, titanium nitride, or other suitable metallurgy. Backfilling with the stud material can be accomplished by conventional deposition techniques, for example by chemical vapor deposition. As shown, the stud material is planarized so as to be substantially coplanar with the insulating material 28 and etch selective elements 24 for forming the contact studs 34. Such planarization can be accomplished by polishing, whereby it is preferable that the stud material have polish selectivity to both the insulating material 28 and the etch selective elements 24. In other words, it is preferable for the stud material to polish at a faster rate than both the insulating material 28 and etch selective elements 24, so that the insulating material 28 and etch selective elements 24 function as "stops" during polishing of the stud material during formation of the studs 34.

The present invention is described and depicted as a process for fabricating a plurality of semiconductor structures. In this regard, it should semiconductor fabrication arts can also be utilized in this invention.

A second layer of photoresist material is then applied and patterned to form a second photoresist mask 30, as shown in FIG. 1F, for etching and removing the sacrificial elements 22. As shown, the second photoresist mask 30 covers the etch selective elements 24 so that they will not be removed, but exposes the sacrificial elements 22. Further, a portion of the insulating material 28 adjacent to the sacrificial elements 22 is also exposed. In this regard, the sacrificial elements 22 should have adequate etch selectivity to the insulating material 28 so that the sacrificial elements 22 can be removed without removing adjacent insulating material 28. Thus, although a high degree of precision and accuracy is not required when forming and patterning the second photoresist mask 30, it is important for the second photoresist mask 30 to cover the etch selective elements 24.

As shown in FIG. 1G, the sacrificial elements 22 are then removed by etching selectively to the insulating material 28 and semiconductor structure 26, and contact windows 32 are formed. The required etch selectivity and anistropy can be achieved, for example, by using the above-mentioned RIE parameters if the sacrificial elements 22 are comprised of boron nitride, the insulating material 28 is comprised of oxide, and the semiconductor structure 26 is comprised of polysilicon, aluminum, silicides, or the like. The second photoresist mask 30 is then removed, and the result is shown in FIG. 1H. As such, the etch selectivity of the sacrificial elements 22 allows formation of the contact windows 32 to be accomplished in a self-aligning manner. be understood that the invention can be used for fabricating as many semiconductor structures as desired, including only a single semiconductor structure. Moreover, although only selected ones of the semiconductor structures are shown to have corresponding studs fabricated thereon, the present invention contemplates that any of the semiconductor structures can be selected to have corresponding studs fabricated thereon. Accordingly, it is possible to fabricate a corresponding stud for only one semiconductor structure or for all of the semiconductor structures.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A process for fabricating a semiconductor structure and stud therefor on a semiconductor substrate, comprising:
   depositing a first material onto said substrate;
   depositing a second material onto said first material;
   removing excess portions of said second material so as to form openings through said second material exposing excess portions of said first material, whereby a selected portion of said second material is retained and forms a sacrificial element;
   removing the excess portions of said first material selectively to said substrate so as to extend said openings through said first material to said substrate, whereby a selected portion of said first material is retained and forms said semiconductor structure, said semiconductor structure having said sacrificial element situated thereon;
   filling said openings with a first insulating material for insulating said semiconductor structure;
   removing said sacrificial element selectively to said insulating material and said semiconductor structure for forming a contact window opening for allowing access to said semiconductor structure; and
   filling said contact window opening with stud material so as to contact said semiconductor structure for forming said stud.

2. A process according to claim 1, wherein said first material comprises a conductive material.

3. A process according to claim 1, wherein the step of removing excess portions of the first material comprises reactive ion etching.

4. A process according to claim 1, wherein the step of removing excess portions of said second material comprises the steps of
   applying photoresist to the second material;
   patterning the photoresist so as to expose excess second material;
   removing the excess second material; and
   removing the photoresist.

5. A process according to claim 4, wherein the step of removing the excess second material comprises reactive ion etching.

6. A process according to claim 1, wherein said sacrificial element has a horizontal width which is about the same as the horizontal width of said semiconductor structure.

7. A process according to claim 6, wherein said stud has a horizontal width which is approximately the same as the horizontal width of said semiconductor structure.

8. A process according to claim 1, wherein said stud has approximately the same dimensions as said sacrificial element.

9. A process according to claim 1, further comprising the step of planarizing said first insulating material relative to said sacrificial element.

10. A process according to claim 9, wherein said sacrificial element planarizes at a slower rate than the first insulating material for functioning as a planarization stop during said step of planarizing said first insulating material.

11. A process according to claim 9, wherein said step of planarizing said first insulating material comprises a step of polishing.

12. A process according to claim 11, wherein said sacrificial element polishes at a slower rate than said first insulating material for functioning as a polish stop during said step of polishing.

13. A process according to claim 1, further comprising the step of planarizing said stud material relative to said first insulating material for forming said stud.

14. A process according to claim 13, wherein said second material comprises a second insulating material, and a selected portion of said second insulating material is retained and forms an etch selective element which planarizes at a slower rate than the stud material for functioning as a planarization stop during said step of planarizing said stud material.

15. A process according to claim 14, wherein said second insulating material comprises boron nitride.

16. A process according to claim 13, wherein said step of planarizing said stud material comprises a step of polishing.

17. A process according to claim 16, wherein said second material comprises a second insulating material, and a selected portion of said second insulating material is retained and forms an etch selective element which polishes at a slower rate than the stud material for functioning as a polish stop during said step of polishing said stud material.

18. A process according to claim 17, wherein said second insulating material comprises boron nitride.

19. A process for fabricating a conductive structure and stud therefor on a semiconductor substrate, comprising:
depositing a conductive material onto said substrate;
depositing a first insulating material onto said conductive material;
removing excess portions of said first insulating material so as to form openings through said first insulating material for exposing excess portions of said conductive material, whereby selected portions of said first insulating material remain unetched and form a sacrificial element and an etch selective element;
removing the excess portions of said conductive material selectively to said substrate so as to extend said openings through said conductive material to said substrate, whereby a selected portion of said conductive material is retained and forms said conductive structure, said conductive structure having said sacrificial element situated thereon;
filling said openings with a second insulating material for insulating said conductive structure;
planarizing said second insulating material relative to said sacrificial element and said etch selective element;
removing said sacrificial element selectively to said second insulating material and said conductive structure for forming a contact window opening for allowing access to said conductive structure; and
filling said contact window opening with stud material so as to contact said conductive structure for forming said stud.

20. A process according to claim 19, wherein said sacrificial element and said etch selective element each planarize at a slower rate than said second insulating material so that said elements function as stops during said step of planarizing said second insulating material.

21. A process according to claim 19, wherein said step of planarizing said second insulating material comprises a step of polishing.

22. A process according to claim 21, wherein said sacrificial element and said etch selective element each polish at a slower rate than said second insulating material so that said elements function as stops during said step of polishing.

23. A process according to claim 19, wherein the step of removing excess portions of the conductive material comprises reactive ion etching.

24. A process according to claim 19, wherein the step of removing excess portions of said first insulating material comprises the steps of
applying photoresist to the first insulating material;
patterning the photoresist so as to expose excess first insulating material;
removing the excess first insulating material; and
removing the photoresist.

25. A process according to claim 24, wherein the step of removing the excess second material comprises reactive ion etching.

26. A process according to claim 19, wherein said sacrificial element has a horizontal width which is about the same as the horizontal width of said semiconductor structure.

27. A process according to claim 26, wherein said stud has a horizontal width which is approximately the same as the horizontal width of said semiconductor structure.

28. A process according to claim 19, wherein said stud has approximately the same dimensions as said sacrificial element.

29. A process according to claim 19, further comprising the step of planarizing said stud material relative to said first insulating material for forming said stud.

30. A process according to claim 29, wherein said step of planarizing said stud material comprises a step of polishing.

31. A process according to claim 19, wherein said first insulating material comprises boron nitride.

* * * * *